United States Patent
Sastry

(10) Patent No.: US 11,397,591 B2
(45) Date of Patent: Jul. 26, 2022

(54) DETERMINING DISORDER IN TECHNOLOGICAL SYSTEM ARCHITECTURES FOR COMPUTER SYSTEMS

(71) Applicant: Kyndryl, Inc., New York, NY (US)

(72) Inventor: Shashidhar Sastry, Pune (IN)

(73) Assignee: Kyndryl, Inc., New York, NY (US)

( * ) Notice: Subject to any disclaimer, the term of this patent is extended or adjusted under 35 U.S.C. 154(b) by 406 days.

(21) Appl. No.: 16/677,105

(22) Filed: Nov. 7, 2019

(65) Prior Publication Data

US 2021/0141651 A1     May 13, 2021

(51) Int. Cl.
| | | |
|---|---|---|
| *G06F 9/445* | (2018.01) | |
| *G06F 9/50* | (2006.01) | |
| *G06N 5/02* | (2006.01) | |
| *G06F 16/9035* | (2019.01) | |
| *G06F 3/04847* | (2022.01) | |

(52) U.S. Cl.
CPC ...... *G06F 9/44505* (2013.01); *G06F 3/04847* (2013.01); *G06F 9/5027* (2013.01); *G06F 16/9035* (2019.01); *G06N 5/02* (2013.01)

(58) Field of Classification Search
CPC ............. G06F 9/44505; G06F 16/9035; G06F 3/04847; G06F 9/5027; G06N 5/02
See application file for complete search history.

(56) References Cited

U.S. PATENT DOCUMENTS

| | | | |
|---|---|---|---|
| 10,181,167 B2* | 1/2019 | Eidelman | G06Q 10/06375 |
| 2010/0312737 A1* | 12/2010 | Coldicott | G06F 16/21 |
| | | | 706/45 |
| 2015/0046899 A1 | 2/2015 | Ganapathy | |
| 2015/0178622 A1* | 6/2015 | Guttmann | G06F 16/285 |
| | | | 706/46 |

(Continued)

FOREIGN PATENT DOCUMENTS

CN        104679650        6/2015

OTHER PUBLICATIONS

Mell et al., "The NIST Definition of Cloud Computing", National Institute of Standards and Technology, U.S. Dept. of Commerce, NIST Special Publ. 800-145, Sep. 2011, 7 pages.

(Continued)

*Primary Examiner* — Aurel Prifti
(74) *Attorney, Agent, or Firm* — Heslin Rothenberg Farley & Mesiti P.C.; Erik Swanson, Esq.

(57) ABSTRACT

A method, computer program product, and a system to generate a total disorder value for architecture of a computing system include a processor(s) obtaining architecture detail for the computing system (the computing system includes function point(s)), and requirements defining aspirational performance benchmarks for the function point(s). The processor(s) identifies physical computing components within the computing systems comprising associated with each of the function points. For each function point, the processor(s) identifies architectural decisions and determines a disorder value for each decision. The processor(s)

(Continued)

generates a total disorder value for the architecture detail by summing the disorder values for each function point. The processor(s) determines if the total disorder value exceeds a pre-defined threshold total disorder value for the computing system.

18 Claims, 11 Drawing Sheets

(56) References Cited

U.S. PATENT DOCUMENTS

| | | |
|---|---|---|
| 2016/0371617 A1 | 12/2016 | Mullaney et al. |
| 2017/0329856 A1* | 11/2017 | Jiang .................... G06N 7/005 |
| 2019/0279097 A1* | 9/2019 | Baines .................. G06N 20/20 |
| 2020/0065712 A1* | 2/2020 | Wang ................. G06F 9/44505 |
| 2020/0167787 A1* | 5/2020 | Kursun .................. H04L 67/22 |
| 2021/0026655 A1* | 1/2021 | Banerjee ............. H04L 41/0853 |
| 2021/0026698 A1* | 1/2021 | Lemberg ............. G06F 11/0754 |
| 2021/0055112 A1* | 2/2021 | Michener ............ G06F 16/9024 |
| 2021/0081837 A1* | 3/2021 | Polleri ..................... G06F 8/41 |
| 2021/0142384 A1* | 5/2021 | Nori .................. G06Q 30/0631 |
| 2021/0303986 A1* | 9/2021 | Saha ........................ G06N 5/02 |

OTHER PUBLICATIONS

Alenezi, "Software Architecture Quality Measurement Stability and Understandability", International Journal of Advanced Computer Science and Applications, vol. 7, No. 7, 2016, 10 pages.

* cited by examiner

DETERMINING DISORDER IN TECHNOLOGICAL SYSTEM ARCHITECTURES FOR COMPUTER SYSTEMS

BACKGROUND

Designing technical architectures for computer systems is a largely manual process that is undertaken by subject matter experts in computing architectures. Various methodologies have been documented to guide these processes and assumptions are made that provided these methodologies are followed by the individuals undertaking the design processes, the resultant architecture will be ordered, meaning that it will control entropy and minimize chaos. The efficacy of these methodologies in currently unsupported by quantitative analyses.

SUMMARY

Shortcomings of the prior art are overcome and additional advantages are provided through the provision of a method for determining the quality of a technical architecture for a computing system. The method includes, for instance: obtaining, by one or more processors, architecture detail for a given computing system, wherein the given computing system comprises one or more function points enabling specific functions within the given computing system, and requirements defining aspirational performance benchmarks for the function points within the given computing system; identifying, by the one or more processors, physical computing components within the given computing systems comprising portions of the architecture detail associated with each of the one or more function points; for each function point and the associated portion of the architecture detail: identifying, by the one or more processors, one or more architectural decisions in the associated portion; determining, by the one or more processors, a disorder value for each architectural decision of the one or more architectural decisions on the associated portion; generating, by the one or more processors, a total disorder value for the architecture detail based on summing the disorder values for each function point of the one or more function points of the architectural detail; and determining, by the one or more processors, if the total disorder value exceeds a pre-defined threshold total disorder value for the given computing system.

Shortcomings of the prior art are overcome and additional advantages are provided through the provision of a computer program product for determining the quality of a technical architecture for a computing system. The computer program product comprises a storage medium readable by a processing circuit and storing instructions for execution by the processing circuit for performing a method. The method includes, for instance: obtaining, by one or more processors, architecture detail for a given computing system, wherein the given computing system comprises one or more function points enabling specific functions within the given computing system, and requirements defining aspirational performance benchmarks for the function points within the given computing system; identifying, by the one or more processors, physical computing components within the given computing systems comprising portions of the architecture detail associated with each of the one or more function points; for each function point and the associated portion of the architecture detail: identifying, by the one or more processors, one or more architectural decisions in the associated portion; determining, by the one or more processors, a disorder value for each architectural decision of the one or more architectural decisions on the associated portion; generating, by the one or more processors, a total disorder value for the architecture detail based on summing the disorder values for each function point of the one or more function points of the architectural detail; and determining, by the one or more processors, if the total disorder value exceeds a pre-defined threshold total disorder value for the given computing system.

Methods and systems relating to one or more aspects are also described and claimed herein. Further, services relating to one or more aspects are also described and may be claimed herein.

Additional features are realized through the techniques described herein. Other embodiments and aspects are described in detail herein and are considered a part of the claimed aspects.

BRIEF DESCRIPTION OF THE DRAWINGS

One or more aspects are particularly pointed out and distinctly claimed as examples in the claims at the conclusion of the specification. The foregoing and objects, features, and advantages of one or more aspects are apparent from the following detailed description taken in conjunction with the accompanying drawings in which:

DETAILED DESCRIPTION

Figure 1:
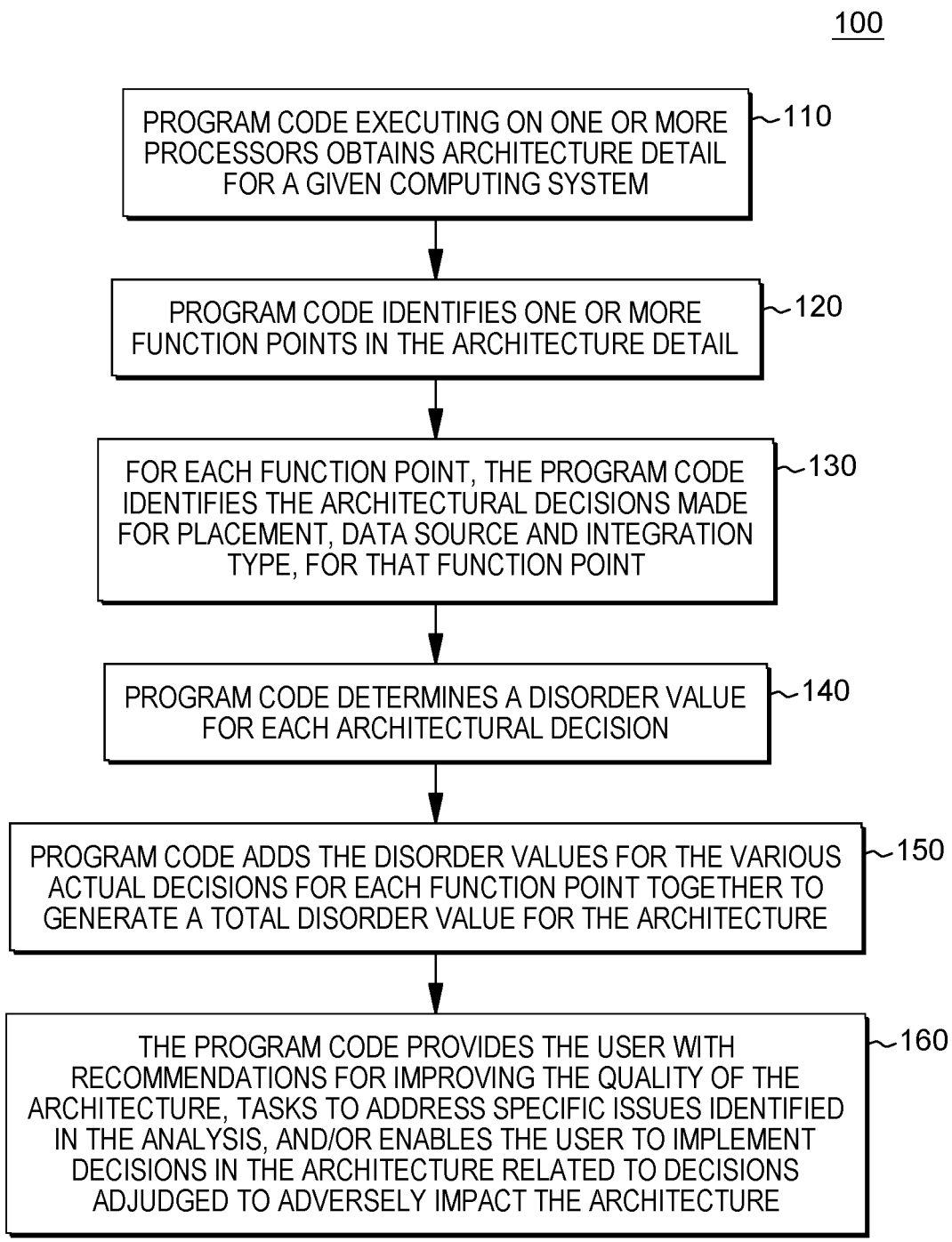
FIG. 1 is a workflow that illustrates certain aspects of some embodiments of the present invention.

The accompanying figures, in which like reference numerals refer to identical or functionally similar elements throughout the separate views and which are incorporated in and form a part of the specification, further illustrate the present invention and, together with the detailed description of the invention, serve to explain the principles of the present invention. As understood by one of skill in the art, the accompanying figures are provided for ease of understanding and illustrate aspects of certain embodiments of the present invention. The invention is not limited to the embodiments depicted in the figures.

Figure 7:
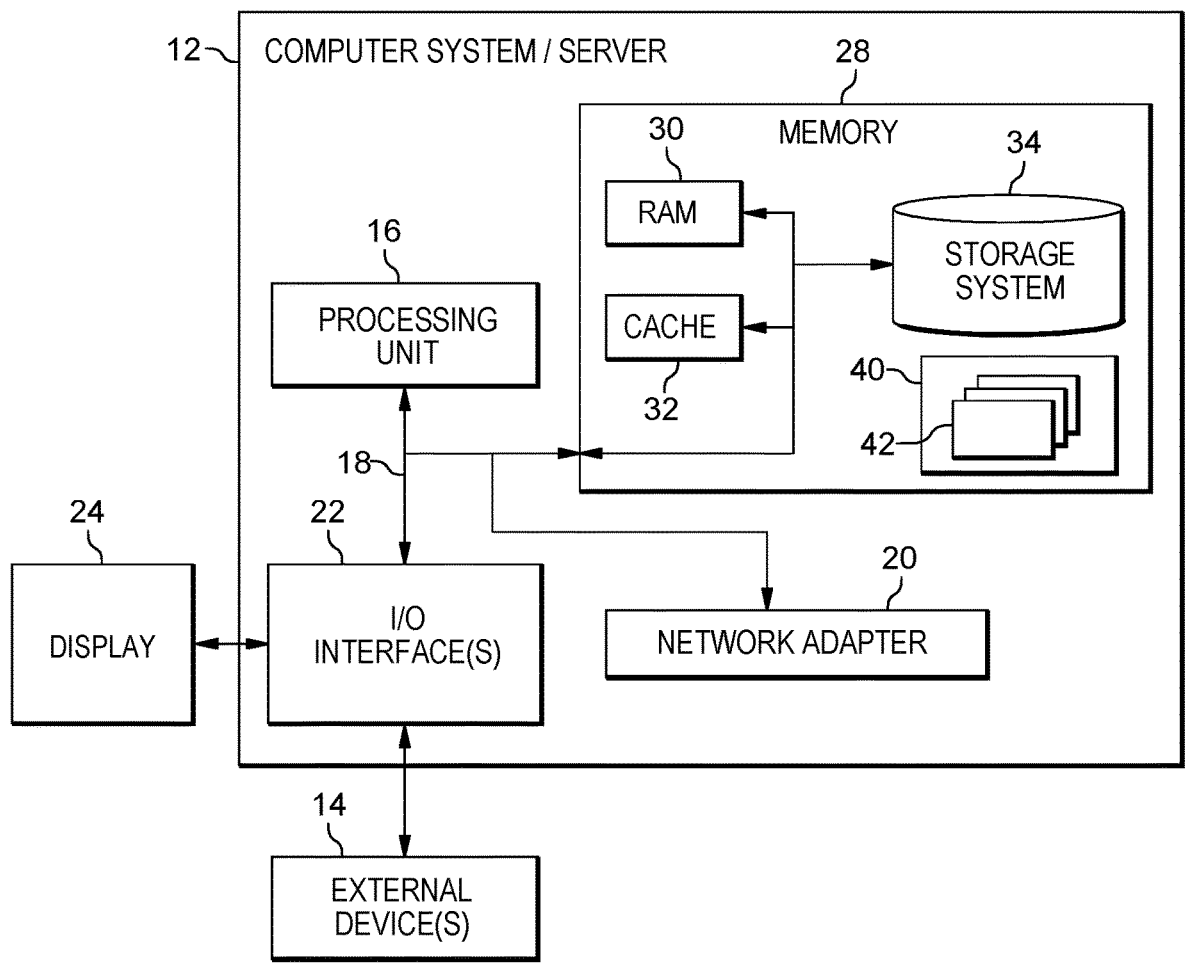
FIG. 7 depicts one embodiment of a computing node that can be utilized in a cloud computing environment.

As understood by one of skill in the art, program code, as referred to throughout this application, includes both software and hardware. For example, program code in certain embodiments of the present invention includes fixed function hardware, while other embodiments utilized a software-based implementation of the functionality described. Certain embodiments combine both types of program code. One example of program code, also referred to as one or more programs, is depicted in FIG. 7 as program/utility 40, having a set (at least one) of program modules 42, may be stored in memory 28.

Embodiments of the present invention include a computer-implemented method, a computer program product, and a computer system where program code executing on at least one processor enables a method for objectively determining a quality value of a technical architecture of a computing environment, including but not limited to a distributed computing environment, such as a cloud computing environment. This quality value is based on the determined order of the system, by the program code. A system with a given value attributed to its order indicates that the system includes a threshold level of chaotic behaviors (e.g., disorder) and the architecture controls entropy to a known degree. These values or measures can be relative to other systems, evaluated by the program code, over time, and can be represented by a value on a given scale, established over time, for example, through machine learning focused on the continuous evaluation of various system architectures for one or more computing systems, by the program code. In this manner, program code in embodiments of the present invention provides an objective measure of architecture quality.

In some embodiments of the present invention, program code determines (e.g., evaluates, measures, etc.) quality of a given architecture for a given computing environment through machine learning that includes digesting reference models over a period of time to enable the program code to compare quality of the given architecture (model) with the digested references to generate metrics to utilize in assigning values to the technical architecture. In certain embodiments of the present invention the program code both generates and applies the (e.g., machine-learned) metrics through a number of aspects, including but not limited to: 1) utilizing technical architectural features, including but not limited to, function placement, data source, and integration type, to monitor a net quality of the architecture of a given system; 2) For each architectural decision in the design, evaluating the relevant instance and type of architectural decision, based on a pre-defined set of principles, standards and policies, to determine a quality (value) for the decision; and 3) deriving a numeric value for the given system architecture by applying a disorder formula, where the numeric value is based on aspects of the system architecture, including but not limited to, data sources, integration types, weights assigned to (program code determined) best (design) decision(s) related to aspects of the architecture design, weights assigned to (program code determined) worst decision(s), weights assigned to (program code determined) in-between decision, and actual decisions in the architecture relative to the (program code determined) best decisions.

As discussed above, designing a technical architecture for a computing system is often a manual process where a subject matter expert, in this case, an information technology (IT) architect, may follow well established principles to formulate the architecture of a computing system, sometimes referred to as an IT system. Presently, although a need can arise to determine whether the (now executed) design has provided a desired quality of architecture to the computing system, often, an architecture is not evaluated to determine if the reality matches the aspirational design. Many existing quality evaluation approaches do not provide a quantitative measure of whether an architecture is meeting a defined quality requirement. When architectures are not quantitatively evaluated pre-implementation and/or post-implementation, the risk of system failure and potential costs and inefficiencies can escalate.

The quantitative evaluation of a system architecture provided in embodiments of the present invention is an objective measurement of the quality of the architecture. A quality architecture, according to evaluations performed by embodiments of the present invention, brings order to an architecture and prevents chaos within the computing system, through the implementation of this order. For example, an effective architecture reduces and controls the entropy of a system. In embodiments of the present invention, the program code derives a metric for architecture quality, which can based on machine learning, and assigns a value from this metric representing the disorder of a system to the architecture of the system. Thus, the program code in embodiments of the present invention enables an objective measurement of the quality of an architecture, compared with other systems, and changes within these systems and the system being evaluated, over time.

Embodiments of the present invention are inextricably tied to computing. Aspects of various embodiments of the present invention address a challenge unique to computing, i.e., determining, quantitatively, quality of a technical architecture. Embodiments of the present invention deal with an issue unique to computing: determining the quality of the architecture of a computing system relative to the functionality and expectations of the system. Embodiments of the present invention provide a unique approach to this issue as a practical application to address this technical issue. Aspects of the present invention isolate particular issues that are negatively impacting the quality of a technical architecture and provide controls that enable a user to target these issues and/or enable the program code to implement architecture changes automatically, that improve the quality of the whole.

Embodiments of the present invention provide a significant advantage over existing methods of technical architecture evaluation. For example, in embodiments of the present invention, the program code automatically evaluates the quality of a system architecture, based on a set of defined properties of the architecture, and the quality is indicative of a level of disorder within the architecture. The level is based on a metric that categorizes or buckets the disorder of the architecture relative to other architectures, over time. Thus, the process of evaluating architectures in embodiments of the present invention is automatic, repeatable, objective, and quantitative. At least these qualities distinguish it from existing approaches to technical architecture evaluation, including but not limited to peer review, governance board review, reference architecture comparison, and total cost of ownership comparison. Unlike peer review, the program code in embodiments of the present invention consistently evaluates each decision within an architecture using consistent criteria to render an objective result; peer reviews not only vary in evaluation criteria, they also do not result in an objective measure for architecture quality assessment. Similarly, review by a governance review board or a member of the board also produces a subjective result, depending upon the individual(s) involved, and the result is also not a measure for architecture quality assessment. Reference architecture comparison assumes the existence and correct selection of another architecture for comparison. In embodiments of the present invention, the program code gains intelligence (machine learns) from varied architectures, over time, in order to provide a result that categorizes the evaluated architecture in the context of architecture, in general, rather than in a limited context of comparison to a selected architecture, only. Total cost of ownership evaluation relies on analyzing comparative costs in a relevant architecture in order to provide a cost analysis. This exercise does not produce an objective measure of technical architecture quality.

In embodiments of the present invention, program code executing on one or more processors determines a quality (value) of a system architecture for a computing system based on elements of architectural features of the system architecture, including but not limited to: function placement, data source, and integration type. Within this framework, the program code, in some embodiments of the present invention, evaluates the quality of each instance and type of architectural decision, based on a set of pre-defined principles, standards and/or policies. In some embodiments, based on this evaluation, the program code determines that each decision is either ideal, less than ideal or the worst. This ranking system is provided as an example, however, in embodiments of the present invention, in order to provide a quantitative evaluation of technical architecture quality, the program code buckets each decision into a defined quality rank and/or level, that is defined by certain metes and bounds. In this way, as the program code digests/learns different system architectures, the program code can evaluate each architecture relative to past architectures, which progressively increases the intelligence of the program code in determining quality of future technical architectures.

As aforementioned, as will be discussed in greater detail herein, in embodiments of the present invention, the program code applies a disorder formula to existing system architectures in order to determine the quality of these architectures. In embodiments of the present invention, the program code applies what is referred to herein as a disorder formula (for ease of understanding) by assigning a numeric value to elements in a technical architecture based on aspects of that architecture, including but not limited to, the number of functions, data sources and integration types, and weights assigned to best decision(s), worst decision(s) and in-between decision(s) (i.e., decision(s) that are not determined by the program code to be either best or worst), and the actual decisions relative to the best decisions that could have been made (as determined by the program code). Architecture quality is inversely proportional to disorder. A higher quality technical architecture is a technical architecture with a disorder closer to zero. As understood by one of skill in the art, the higher the disorder within a technical architecture of a computing system, the more chaotic the architecture is, rendering it difficult to manage, expensive to change, and/or susceptible to functional risk.

FIG. 1 is a workflow 100 that illustrates various aspects of some embodiments of the present invention. These aspects will be illustrated in further detail in non-limiting examples provided herein. Referring to FIG. 1, in some embodiments of the present invention, program code executing on one or more processors obtains architecture detail for a given computing system (110). The architectural detail defines the architectural landscape (metes and bounds and data in-between) to be evaluated by the program code. In an embodiments of the present invention, the program code identifies one or more function points in the architecture detail (120). As will be illustrated in the examples that follow, the program code evaluates the quality of a given architecture detail based on a pre-defined set of architectural features that comprise the architecture detail. The program code bases the quality determination on these pre-defined evaluated features, determining a net quality of the system architecture based on the pre-defined evaluated features. In some embodiments of the present invention, the features pre-defined evaluated features for each function point include: function placement, data source, and integration type. The program code determines an overall quality of the architecture based on individual architecture function point values. As illustrated in FIG. 1, the function point values reflect a quality of the decision in implementing these elements in the technical architecture. In some embodiments of the present invention, the decision quality can be one of three levels: ideal, less the ideal, and worst. These definitive rankings provide quantitative values to these function points.

Returning to FIG. 1, in some embodiments of the present invention, for each function point, the program code identifies the architectural decisions made for placement, data source and integration type, for that function point (130). Although the program code in embodiments of the present invention can be applied to complex decisions in technical architectures, illustrating the evaluation of decisions with a less complex example is provided herein for illustrative purposes. For example, in a technical architecture, a given decision for a function point, related to the data source, is if some data required by a transactional system of engagement is to be copied locally or accessed from a remote master. Elements that would shape this decision in architectural design include, but are not limited to, the desired speed for completion of a user transaction utilizing this data, the demand for current data (how frequently and quickly the data should be updated), whether the data is to be transformed in a manner specific to the consuming system, etc. A consideration of these factors can result in an objective decision.

The program code determines a disorder value for each architectural decision (140). As discussed above, in embodiments of the present invention, the program code determines that each decision is of a quantifiable quality in a finite set, e.g., ideal, less the ideal, and worst. The amount of disorder in a given architecture would not be increased if an ideal decision is implemented, thus, an ideal decision can be quantified by a disorder value of zero (0). In evaluating each decision based on placement, data source and integration type to determine a disorder value, each element of this determination is not given equal weight, in some embodiments of the present invention, based on the known impact the given element can have on the disorder introduced by the element. The program code evaluates data sourcing based on the potential for this element to introduce a highest amount of disorder (relative to the other elements). This highest amount is based on potential impacts to architecture disorder introduced by functional issues related to data sourcing, including but not limited to, inconsistent or unreliable data, storing and retrieval of data, costs of transporting data compared to other (sub-optimal) architecture decisions, etc. Quantitatively, the next highest amount of disorder can be introduced into an architecture by function placement. The lowest amount of disorder (relative to the other elements), is potentially introduced by integration pattern.

The processing involved in generating disorder values for the various decision and function points can be managed in a variety of ways with the one or more processors executing the program code. In some embodiments of the present invention, the program code determines the disorder values associated with each decision for the one or more function points in parallel, in some embodiments of the present invention, the program code cycles through the various function points and/or associated decisions to generate disorder values for the decisions associated with the function points.

In some embodiments of the present invention, the program code assigns numerical ranges (ordinal values) for disorder values. The range of values can be varied, but consistent over time. For non-limiting examples provided for illustrative purposes herein, ranges between 0 and 50 are utilized. The various values are selected to provide comparative measures, thus, depending both on the complexity of a given architecture being evaluated by the program code in an embodiment of the present invention, and the number of times that the system has been utilized to evaluate various architectures, a range can be utilized that enables quantitative differentiation between values. In the examples below, utilizing a given range, each element (placement, data source and integration type) of a decision for a function point, is provided with a potential disorder value, based on the level: ideal, less the ideal, and/or worst.

Data Source Architecture Decision Disorder Values (by level):
   Ideal architectural decision disorder value=0
   Less Than Ideal architectural decision disorder value=10
   Worst architectural decision disorder value=50
   Function Placement Architecture Decision Disorder Values (by level):
   Ideal architectural decision disorder value=0
   Less Than Ideal architectural decision disorder value=5
   Worst architectural decision disorder value=20
   Integration Pattern Architecture Decision Disorder Values (by level):
   Ideal architectural decision disorder value=0
   Less Than Ideal architectural decision disorder value=2
   Worst architectural decision disorder value=10

Returning to the simplified example with the data source, just for purposes of the example, an ideal decision is to make a local copy of the data, to meet the functional and non-functional requirements of the application and the worst decision is to access the data remotely. There are therefore three outcomes for a disorder values in the decision: 1) the ideal decision is made; data is copied locally; 2) the worst decision is made; data is accessed from a remote system during a transaction; and 3) a less than ideal decision is made; e.g., data is accessed from the remote system, but a temporary cache is created.

Returning to FIG. 1, in some embodiments of the present invention, as aforementioned, the program code assigns disorder values to each decision in a function point in the technical architecture (140). In various embodiments of the present invention, the program code refers to a data source of compiled past decisions for function points in order to assign values to each function point identified. Thus, in some embodiments of the present invention, the program code accesses one or more data stores with historical information of architectures previously evaluated in order to determine a disorder level (ideal, less the ideal, and/or worst) for a given decision at a function point in the architecture. In some embodiments of the present invention, the program code assigns a disorder value to the actual decision that was taken in the architectural framework. For example, using the framework above, for data sources, if the ideal decision was taken, the disorder value=0, if a less than ideal decision was taken, the disorder value=10 and if the worst decision was taken, the disorder value=50. The program code individually evaluates each actual decision related to a function point and determines if it is an ideal, a less than ideal, or a worst decision. By bucketing these decisions definitively, a quantitative measure of value can be derived by the program code and easily compared to alternative architectures.

In some embodiments of the present invention, the program code determines whether a given actual decision is ideal, less than ideal, or worst by applying a pre-defined litmus test. Some embodiments of the present invention include program code (e.g., one or more modules) that defines litmus tests for each of the types of architecture decisions utilized to evaluate a function point (e.g., function placement, data source, integration type). The program code (with increased intelligence through repetition enabling cognitive analysis and machine-learning) applies these litmus tests and scores the decisions in the technical architecture. These tests and scores will then become a part of the scoring for the overall architecture. Tables 1-3 below provide non-limiting examples of litmus tests for function placement, data source, integration type, that the program code can utilize in determining a disorder value for the actual decision (implementation) in the architecture being evaluated by the program code.

Table 1 below is an example of a litmus test for a data source that can be applied to the earlier discussed data source example. The litmus test includes requirements of this feature (functional and non-functional) in the computing system to assist in determining the disorder value of the actual decision in the architecture in the implementation of the feature. In the first row, the evaluation (by the program code) looks at the techno-commercial-time ability of the source to scale up to meet load and response requirements. Thus, a negative score means "DO NOT COPY" while a positive score means "COPY." As seen below, a 0 score is effectively a deadlock that can be broken by changing either a capability on the source or a requirement. In the types column, P refers to performance, S refers to security, A refers to availability, and F refers to function. Where Y=1 and N=0, Y refers to Yes and N refers to No. In the weight or weightage range, the positive weights favour copying (data locally).

TABLE 1

| Srl. No. | Functional or Non-Functional Requirement of Data Client | Type | Y = 1, N = 0 | Weight (1-5) | Related Capability from Source System | Y = 1, N = 0 | Weighted Score negated with column F |
|---|---|---|---|---|---|---|---|
| 1 | Very low latency required in getting information for use case [<100 mS] | P | 1 | 5 | Data source is more suited to copying than direct access | 1 | 5 |
| 2 | Security of data in storage and | S | 1 | −2 | Storage and transport | 1 | −2 |

TABLE 1-continued

| Srl. No. | Functional or Non-Functional Requirement of Data Client | Type | Y = 1, N = 0 | Weight (1-5) | Related Capability from Source System | Y = 1, N = 0 | Weighted Score negated with column F |
|---|---|---|---|---|---|---|---|
| | transport is a high concern | | | | cannot be encrypted | | |
| 3 | Client needs data to be highly available | A | 1 | 2 | Availability of client is more than of source | 1 | 2 |
| 4 | Tolerance is zero for outdated data in client's use case(s) | F | 1 | −5 | Data Synch is not possible | 1 | −5 |
| 5 | Client needs data over a longer period of time than is retained in source | F | 0 | 5 | Data source cannot increase retention period | 1 | 0 |
| 6 | Application needs to collate and compare data from multiple sources at different times for its functions | F | 0 | 4 | Amount of data to be collated and compared is high. All sources cannot be synchronized or baselined for time. | 1 | 0 |
| | | | | Total | | | 0 |

Table 2 below is a function placement litmus test executed by the program code in some embodiments of the present invention. The functional requirements and the non-functional requirements in the litmus test are assigned pre-defined weights (W) and are evaluated in terms of the fit within the implementation in the architecture. By applying this litmus test, like that of Table 1, the program code evaluates both functional and non-functional requirements. The fit percentages in this litmus test are an existing system fit percentage, option 1 fit percentage (i.e., a new system fit percentage), option 2 fit percentage (i.e., a new system fit percentage), option 3 fit percentage (i.e., a new system fit percentage), and a bespoke fit percentage.

TABLE 2

| Functional Requirements (Weight 40%) | W | Exstng Fit % | Score | Op 1 Fit % | Score | Op 2 Fit % | Score | Op 3 Fit % | Score | Bspke Fit % | Score |
|---|---|---|---|---|---|---|---|---|---|---|---|
| Req1 | 4 | 10 | 40 | 90 | 360 | 25 | 100 | 80 | 320 | 100 | 400 |
| Req2 | 4 | 10 | 40 | 90 | 360 | 35 | 140 | 10 | 40 | 100 | 400 |
| Req3 | 4 | 40 | 160 | 60 | 240 | 45 | 180 | 70 | 280 | 100 | 400 |
| Req4 | 4 | 100 | 400 | 0 | 0 | 55 | 220 | 30 | 120 | 100 | 400 |
| Req5 | 4 | 40 | 160 | 60 | 240 | 65 | 260 | 90 | 360 | 100 | 400 |
| Req6 | 4 | 90 | 360 | 10 | 40 | 75 | 300 | 20 | 80 | 100 | 400 |
| Req7 | 4 | 60 | 240 | 40 | 160 | 15 | 60 | 100 | 400 | 100 | 400 |
| Req8 | 4 | 30 | 120 | 70 | 280 | 5 | 20 | 10 | 40 | 100 | 400 |
| Req9 | 4 | 20 | 80 | 80 | 320 | 10 | 40 | 80 | 320 | 100 | 400 |
| Req10 | 4 | 0 | 0 | 100 | 400 | 20 | 80 | 0 | 0 | 100 | 400 |
| Non-Functional Requirements (Weight 20%) | | | | | | | | | | | |
| Scalability | 2 | 30 | 60 | 70 | 140 | 95 | 190 | 0 | 0 | 100 | 200 |
| Manageability | 2 | 50 | 100 | 50 | 100 | 85 | 170 | 90 | 180 | 50 | 100 |
| Extensibility | 2 | 100 | 200 | 0 | 0 | 75 | 150 | 20 | 40 | 10 | 20 |
| Security | 3 | 90 | 270 | 10 | 30 | 65 | 195 | 70 | 210 | 100 | 300 |
| Resilience | 2 | 30 | 60 | 70 | 140 | 55 | 110 | 15 | 30 | 100 | 200 |
| Availability | 2 | 20 | 40 | 80 | 160 | 45 | 90 | 50 | 100 | 100 | 200 |
| Vendor Organization Maturity | 3 | 60 | 180 | 40 | 120 | 60 | 180 | 10 | 30 | 30 | 90 |
| References | 4 | 20 | 80 | 80 | 320 | 70 | 280 | 5 | 20 | 0 | 0 |
| TCO (Weightage 40%) | | | | | | | | | | | |
| Capital Expenditure | 30 | 30 | 900 | 70 | 2100 | 90 | 2700 | 30 | 900 | 10 | 300 |

TABLE 2-continued

| Functional Requirements (Weight 40%) | W | Exstng Fit % | Score | Op 1 Fit % | Score | Op 2 Fit % | Score | Op 3 Fit % | Score | Bspke Fit % | Score |
|---|---|---|---|---|---|---|---|---|---|---|---|
| Operational Expenditure | 10 | 100 | 1000 | 0 | 0 | 100 | 1000 | 80 | 800 | 20 | 200 |
| | | Total Scores | 4490 | | 5510 | | 6465 | | 4270 | | 5610 |

Table 3 below is an integration litmus test executed by the program code in some embodiments of the present invention. The functional requirements in the litmus test are assigned pre-defined weights for various requirements for the architecture of the function point and are evaluated. By applying the litmus test below, the program code evaluates decisions related to an enterprise application integration (EAI). As understood by one of skill in the art, EAI refers to the use of technologies and services across an enterprise to enable the integration of software applications and hardware systems. Many proprietary and open projects provide EAI solution support and EAI is related to middleware technologies. The litmus test below evaluates whether an EAI should be utilized in integrating the data referred to in the example discussed. When applying the litmus test illustrated in Table 3 below, a score of less than or equal to 6 indicates that an EAI should be utilized for the disorder value to be desirable (the architecture to be of the desired quality).

TABLE 3

| No. | Technical Capability Requirement | Required = 1 else 0 | Weight (1-5) | Weighted Score |
|---|---|---|---|---|
| 1 | Reuse of pre-existing EAI service | 0 | 3 | 0 |
| 2 | Protocol Transformation | 0 | 3 | 0 |
| 3 | Request/response object transformation | 0 | 2 | 0 |
| 4 | Information or function aggregation across multiple sources | 0 | 2 | 0 |
| 5 | Information or function from changing source | 0 | 2 | 0 |
| 6 | Throttling to prevent overload of service | 1 | 2 | 2 |
| 7 | Covering for failures of call to end point | 1 | 1 | 1 |
| 8 | Covering for failures of call back to client | 1 | 1 | 1 |
| 9 | Asycnh service to synch response conversion | 1 | 1 | 1 |
| 10 | Synch service to asynch call back conversion | 1 | 1 | 1 |
| 11 | Avoid polling and get information when required | 1 | 1 | 1 |
| 12 | Need Publish-Subscribe framework | 1 | 4 | 4 |
| 13 | Need abstraction of deployment architecture of source systems | 1 | 3 | 3 |

TABLE 3-continued

| No. | Technical Capability Requirement | Required = 1 else 0 | Weight (1-5) | Weighted Score |
|---|---|---|---|---|
| 14 | (e.g. multiple ISMS servers for circles) Need to connect to DB directly from EAI but EAI layer has no connection pooling capability | 1 | -4 | -4 |
| | | | Total score | 10 |

Referring to FIG. 1, the program code adds the disorder values for the various actual decisions for each function point together to generate a total disorder value for the architecture (150). The equation below, Equation 1, illustrates the calculation of a total disorder value for a given decision related to a function point in a technical architecture.

For Equation 1:

AD=Architecture Decision

FP=Function Placement; FPLAD#=Function Placement Location Architecture Decision Number; FPLAD#-DV=FPLAD# Disorder Value; Possible values: 0=Ideal AD, 5=Less than ideal AD, 20=Worst AD DS=Data Source; DSAD#=Data Source Architecture Decision; DSAD#-DV=DSA#D Disorder Value; Possible values: 0=Ideal AD, 10=Less than ideal AD, 50=Worst AD IP=Integration Pattern; IPAD#=Data Source Architecture Decision Number; IPAD#-DV=IPAD# Disorder Value; Possible values: 0=Ideal AD, 2=Less than ideal AD, 10=Worst AD Thus, by applying Equation 1, the program code evaluates the defined aspects of a given decision related to a function point in a technical architecture which can impact the disorder of the computing system employing the technical architecture: function placement, data source, and integration. The program code executing on one or more processors in some embodiments of the present invention applies Equation 1 to determine a total disorder value for the technical architecture of a computing system.

$$\text{Total Disorder Value of the Architecture of the Computing System} = \text{FPLAD1-DV} + \text{FPLAD2-DV} + \text{FPLAD3-DV} + \ldots * + \text{DSAD1-DV} + \text{DSAD2-DV} + \text{DSAD3-DV} + \ldots * + \text{IPAD1-DV} + \text{IPAD2-DV} + \text{IPAD3-DV} + \ldots * + \quad \text{Equation 1:}$$

Upon determining a total disorder value, in some embodiments of the present invention, the program code displays, to the user, in an interface, the decisions that most adversely impact the disorder of the architecture, impacting quality. The program code can provide the user with the option of changing a configuration in the architecture to address one or more of the issues. In some embodiments of the present invention, the program code can provide the user, through the interface, with the opportunity to accept or reject the evaluated architecture, based on the total disorder score. Thus, in some embodiments of the present invention, the program code provides the user with recommendations for improving the quality of the architecture, tasks to address specific issues identified in the analysis, and/or enables the user to implement decisions in the architecture related to decisions adjudged to adversely impact the architecture (e.g., less than ideal decisions, worst decisions) (160). In some embodiments of the present invention, the program code automatically implements configuration changes to the architecture that would address the issues identified by the program code. In some embodiments of the present invention, the technical architecture being evaluated by the program code is a model/simulation, that can be changed by the program code, resulting in an updated model/simulation.

Figure 3:
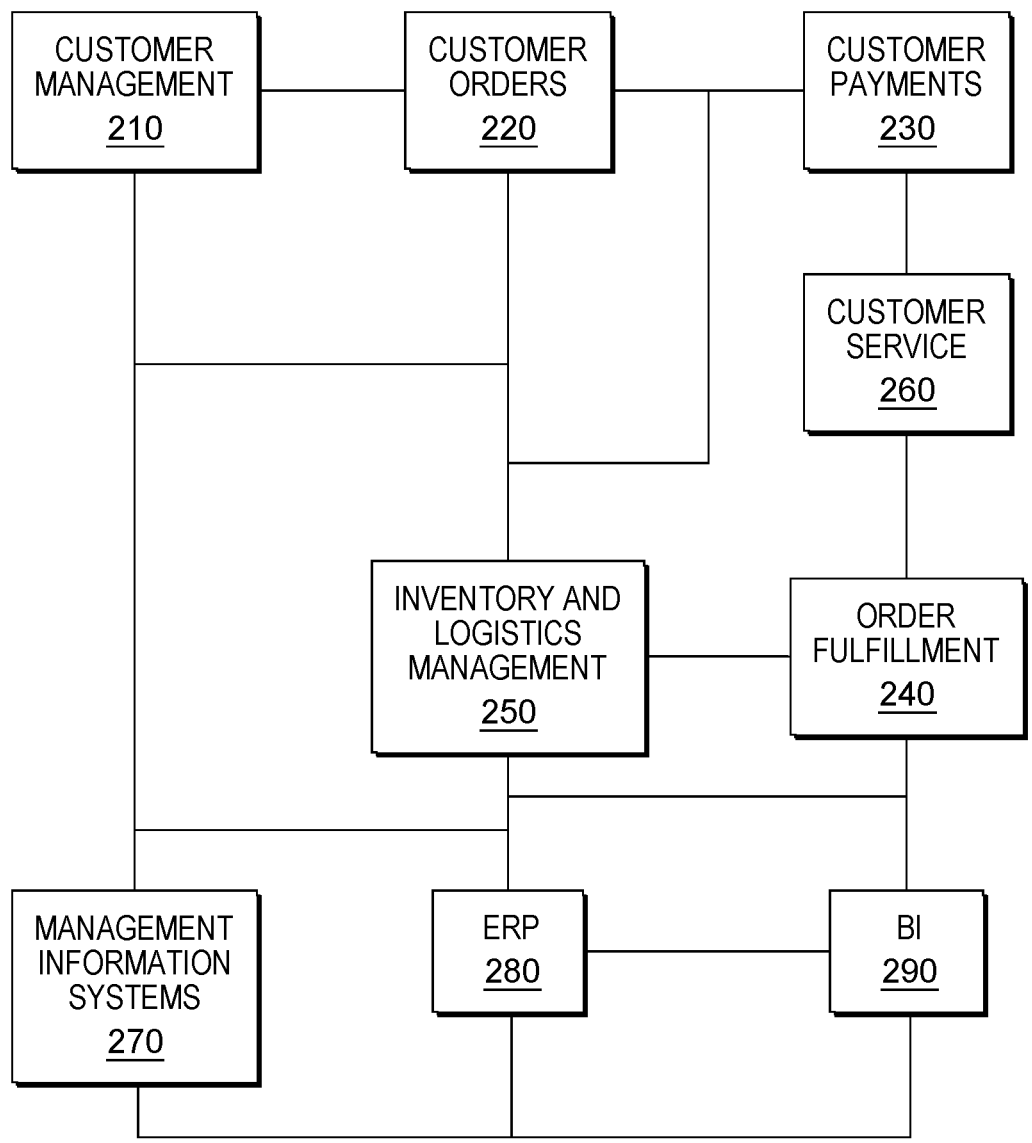
FIG. 3 is a simplified view of the technical architecture of FIG. 2.
Figure 4:
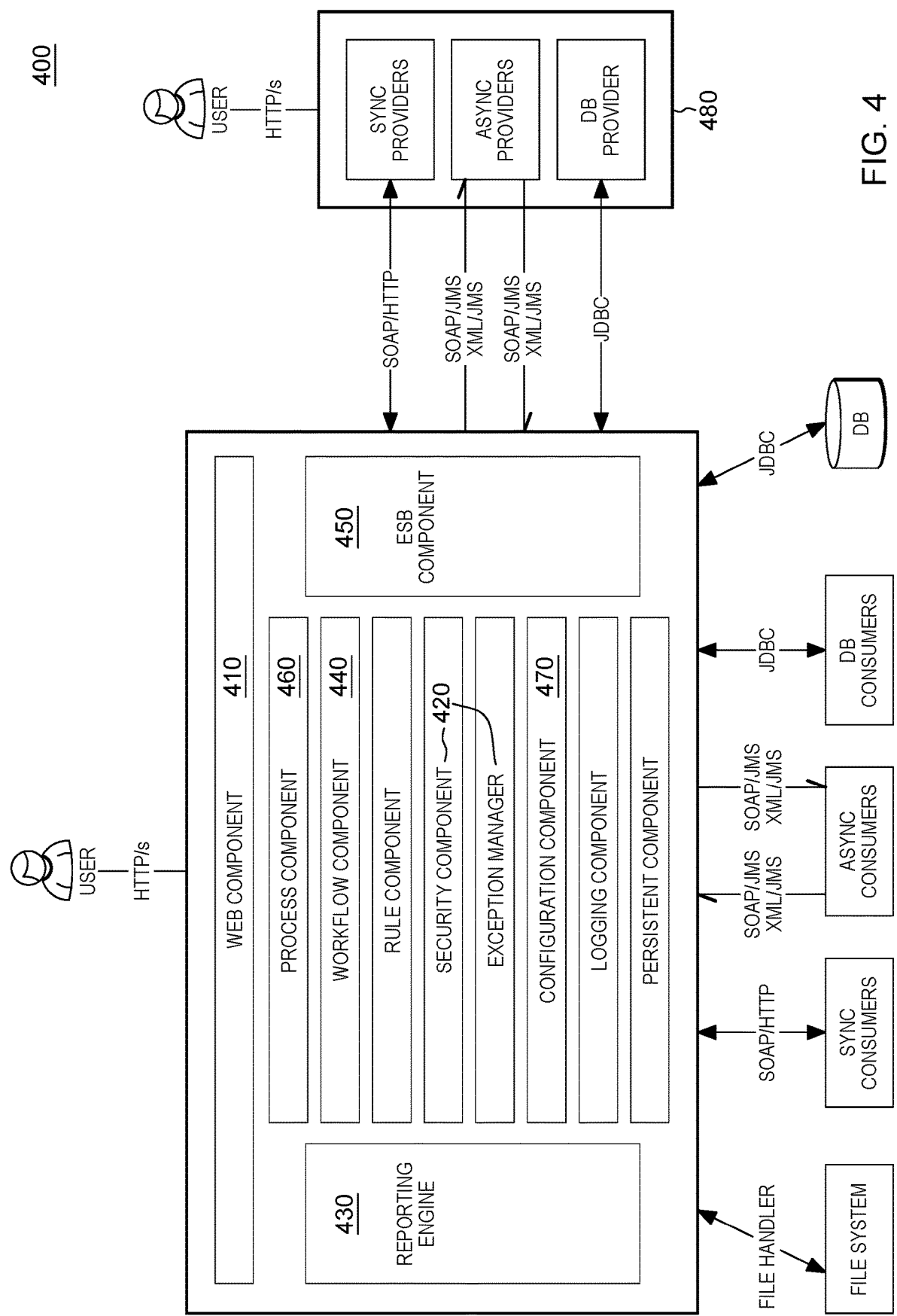
FIG. 4 is a technical architecture that can be evaluated utilizing aspects of some embodiments of the present invention.
Figure 5:
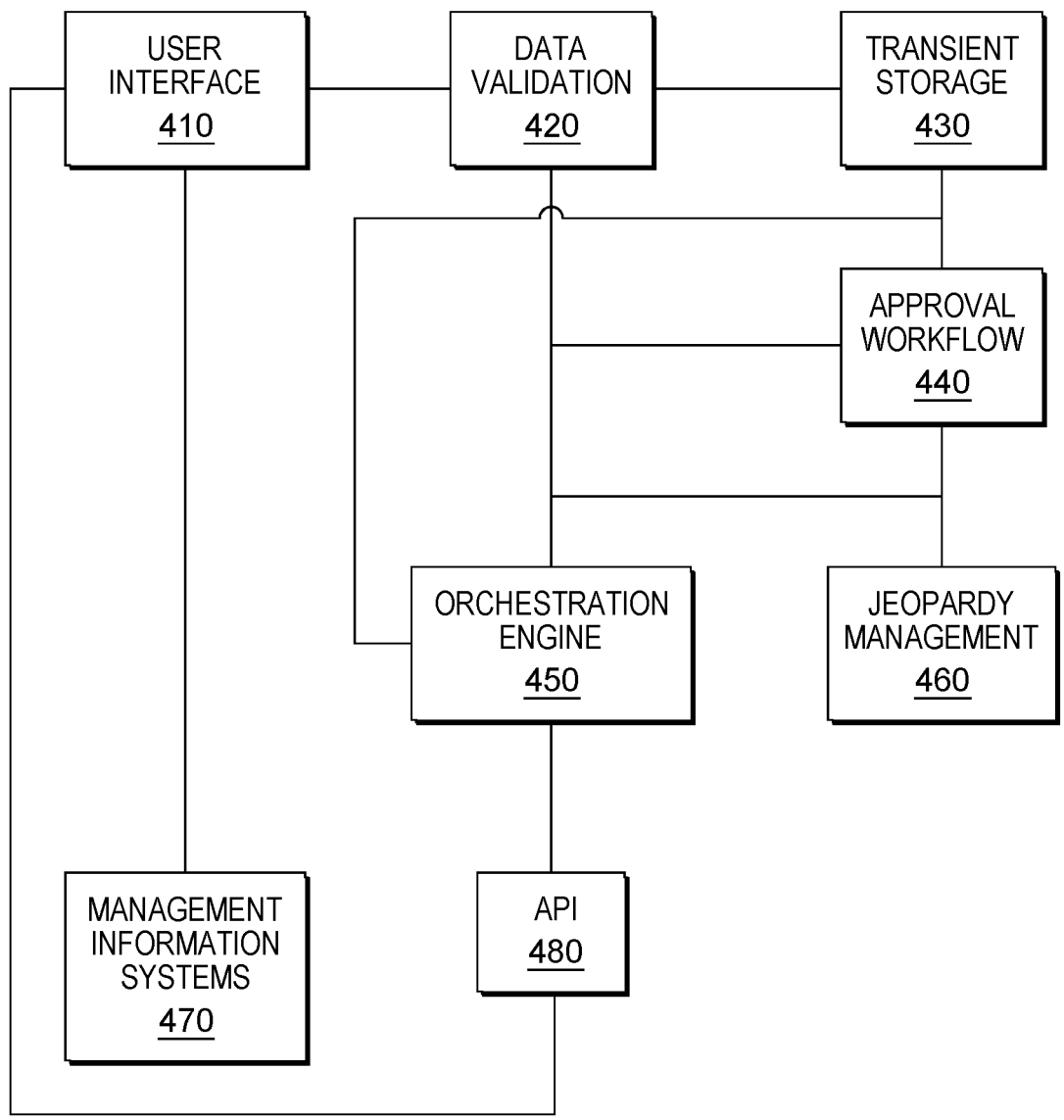
FIG. 5 is a simplified view of the technical architecture of FIG. 4.

Embodiments of the present invention can be applied to complex technical architectures. FIGS. 2-5 are architectures evaluated in accordance with some embodiments of the present invention. FIGS. 2-3 are an enterprise architecture 200 while FIGS. 4-5 are a technical architecture for a data management system 300. Although FIGS. 2-3 portray the same architecture, as do FIGS. 4-5, the latter of each figures depicts a simplified version of the architectural aspects being analyzed by program code in embodiments of the present invention, in order to provide a quality score. Additionally, in illustrating embodiments of the present invention with these architectures, reference is made to the workflow 100 of FIG. 1. These references are made for illustrative purposes, only, and do not suggest any limitations to future implementations of various aspects of embodiments of the present invention disclosed herein.

Figure 2A:
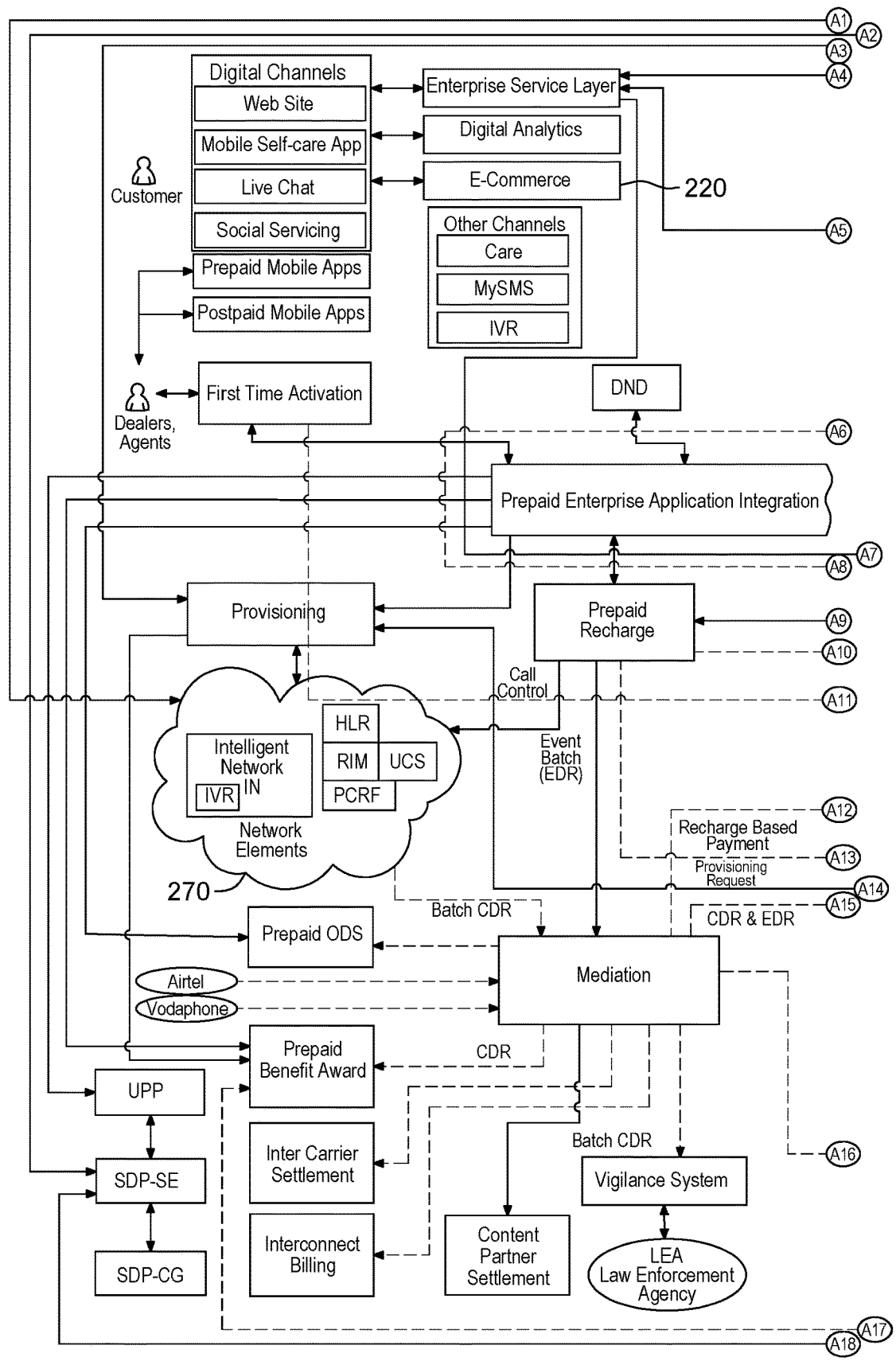
FIG. 2 (including FIGS. 2A-2C) is a technical architecture that can be evaluated utilizing aspects of some embodiments of the present invention.
Figure 2B:
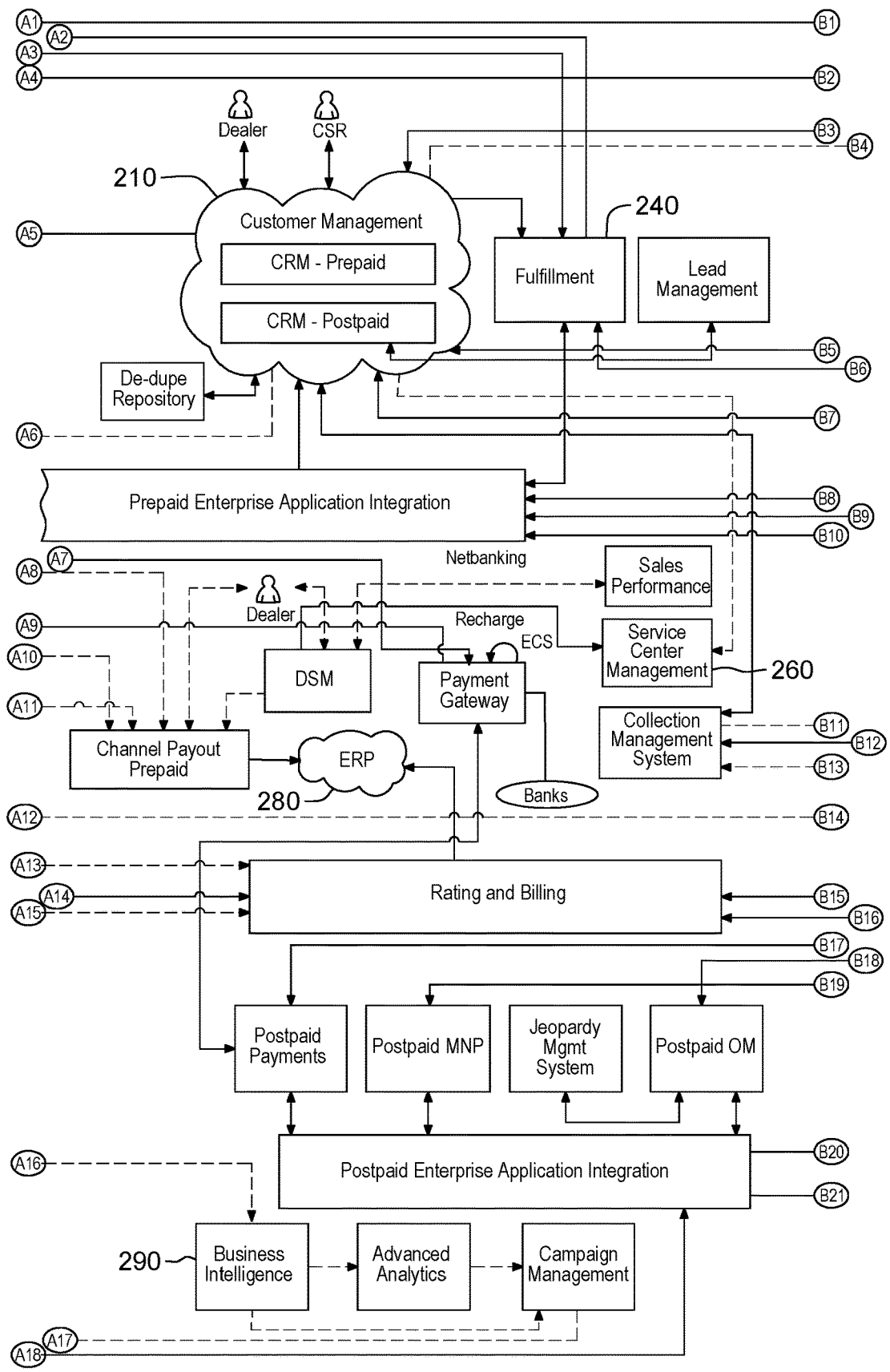
Figure 2C:
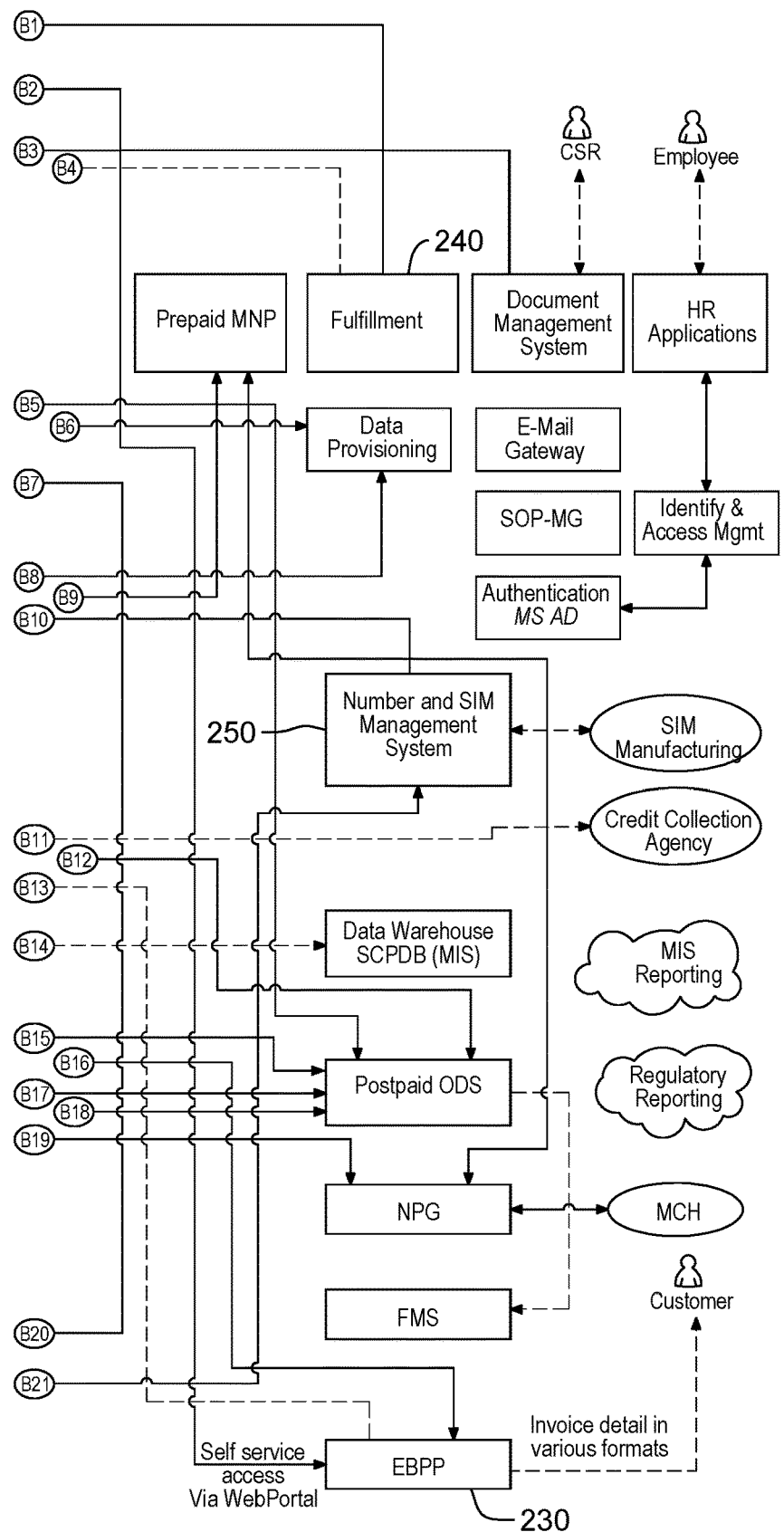

Referring to the enterprise architecture 200 of FIG. 2 (inclusive of FIGS. 2A-2C), in some embodiments of the present invention, the program code obtains the data comprising the architectural detail of the enterprise architecture 200 (e.g., FIG. 1, 110). The program code identifies the function points in the architectural detail of the enterprise architecture 200 (e.g., FIG. 1, 120). The program code identifies the function points in the architectural detail of the enterprise architecture 200 as customer management 210 (FP1), customer orders 220 (FP2), customer payments 230 (FP3), order fulfilment 240 (FP4), inventory and logistics management 250 (FP5), customer service 260 (FP6), management information systems 270 (FP7), enterprise resource planning (ERP) 280 (FP8), and business intelligence (BI) 290 (FP9). In some embodiments of the present invention, the program code references a database with descriptive data about solutions in order to automatically identify the function points on the architectural detail of the enterprise architecture 200. In some embodiments of the present invention, a user can input this data via an interface, which is obtained by the program code. The program code identifies architectural decisions made for placement, data source, and integration type, for the identified functional points (e.g., FIG. 1, 130) and determines a disorder value for each decision (e.g., FIG. 1, 140). In this example, for ease of understanding, the program code evaluates one decision for each functional point, in order to simplify the illustration, only. More than one decision can be associated with a given function point. The program code applies a litmus test (obtained from a data source) in order to determine the disorder value for each decision. In some embodiments of the present invention, the program code learns disorder values for given decisions by evaluating and monitoring past architectures. Thus, the program code can determine the disorder values for the various decisions based on historically applied values. To continue the example of the architectural detail of the enterprise architecture 200 of FIGS. 2-3, the program code determines disorder values for the decisions related to the function points.

Function Points and AD-DVs:
FP1 Customer Life Cycle Management 210:
FPAD1-DV=0, DSAD1-DV=0, IPAD1-DV=2
FP2 Customer Orders 220:
FPAD1-DV=0, DSAD1-DV=0, IPAD1-DV=0
FP3 Customer Payments 230:
FPAD1-DV=0, DSAD1-DV=0, IPAD1-DV=0
FP4 Order Fulfilment 240:
FPAD1-DV=5, DSAD1-DV=10, IPAD1-DV=0
FP5 Inventory & Logistics Management 250:
FPAD1-DV=0, DSAD1-DV=10, IPAD1-DV=2
FP6 Customer Service 260:
FPAD1-DV=0, DSAD1-DV=0, IPAD1-DV=2
FP7 Management Information System 270:
FPAD1-DV=20, DSAD1-DV=50, IPAD1-DV=0
FP8 ERP 280:
FPAD1-DV=0, DSAD1-DV=0, IPAD1-DV=0
FP9 BI 290:
FPAD1-DV=5, DSAD1-DV=0, IPAD1-DV=10
Resulting Total DV=116

Based on the individual disorder values, the program code determines, based on a minimum possible DV=0, a maximum possible DV=80*9=720, that the observed DV=~16% of maximum value. The program code provides the user with the option of accepting the technical architecture, based on this evaluation and/or changing aspects of certain design choices (e.g., FP7), in order to improve the disorder value. The program code can be configured with thresholds in order to represent whether a given percentage is anticipated to be acceptable for a given function point and/or overall computing system. For example, in some embodiments of the present invention, values greater than or equal to about 20% are considered too disordered to be utilized as the architectures for computing systems.

Turning to FIGS. 4-5, which depict an application architecture of a master data management application 400. In some embodiments of the present invention, the program code obtains the data comprising the architectural detail of the data management application architecture 400 (e.g., FIG. 1, 110). The program code identifies the function points in the architectural detail of the data management application architecture 400 (e.g., FIG. 1, 120). The program code identifies the function points in the architectural detail of the data management application architecture 400 as user interface 410 (FP1), data validation 420 (FP2), transient storage 430 (FP3), approval workflow 440 (FP4), orchestration engine 450 (FP5), jeopardy management 460 (FP6), management information systems 270 (FP7), and external application programming interface (API) 480 (FP8). The program code can reference a database with descriptive data about solutions in order to automatically identify the function points on the architectural detail of the data management application architecture 400. A user can also input this data (e.g., the function points for a given architecture) via an interface, which is obtained by the program code. The program code identifies architectural decisions made for placement, data source, and integration type, for the identified functional points (e.g., FIG. 1, 130) and determines a disorder value for each decision (e.g., FIG. 1, 140). In this example, as in the last, for ease of understanding, the program code evaluates one decision for each functional point, in order to simplify the illustration, only. In some embodiments of the present invention, the program code applies a litmus test (obtained from a data source) in order to determine the disorder value for each decision. In some embodiments of the present invention, the program code learns disorder values for given decisions by evaluating and monitoring past architectures. Thus, the program code can determine the disorder values for the various decisions based on historically applied values. To continue the example of the architectural detail of the data management application architecture 400 of FIGS. 4-5, the program code determines disorder values for the decisions related to the function points.

Function Points and AD-DVs:
FP1 User Interface 410:
FPAD1-DV=5, DSAD1-DV=10, IPAD1-DV=2
FP2 Data Validation 420:
FPAD1-DV=5, DSAD1-DV=0, IPAD1-DV=10
FP3 Transient Storage 430:
FPAD1-DV=0, DSAD1-DV=0, IPAD1-DV=0
FP4 Approval Work Flow 440:
FPAD1-DV=5, DSAD1-DV=10, IPAD1-DV=10
FP5 Orchestration Engine 450:
FPAD1-DV=20, DSAD1-DV=10, IPAD1-DV=2
FP6 Jeopardy Management 460:
FPAD1-DV=0, DSAD1-DV=50, IPAD1-DV=2
FP7 Management Information System 470:
FPAD1-DV=0, DSAD1-DV=0, IPAD1-DV=0
FP8 External API 480:
FPAD1-DV=5, DSAD1-DV=0, IPAD1-DV=10
Resulting Total DV=156

Based on the individual disorder values, the program code determines, based on a minimum possible DV=0, a maximum possible DV=80*8=640, that the observed DV=~25% of maximum value. Using the thresholds provided in the last example (e.g., values greater than or equal to about 20% are considered too disordered to be utilized as the architectures for computing systems), the program code in some embodiments of the present invention recommends that the user cease utilization of the evaluated architecture. The program code can notify the user, e.g., through an alert in a user interface, that the user should change the architecture before implementation and/or continued use. Based on the results provided, the program code can recommend improving FP5 first, and then proceeding to other values with less disorder, until the program code re-evaluates the architecture and determines that the disorder value is within the pre-defined tolerance. In some embodiments of the present invention, as the user changes the architecture detail, the program code progressively updates the disorder value. The program code can reference past analyses to recommend specific decision differences to the user and can implement decision differences, automatically, in some embodiments of the present invention.

Figure 6:
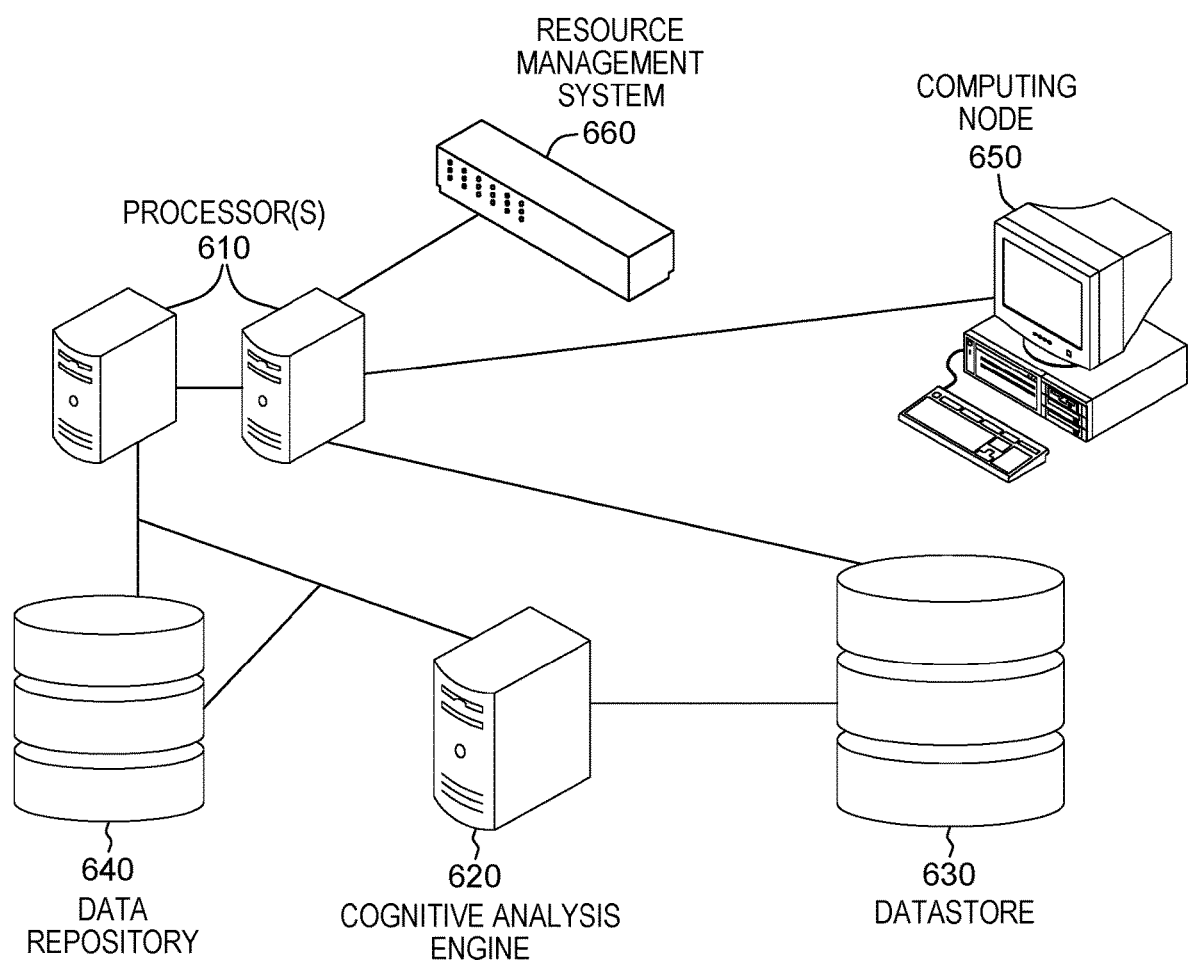
FIG. 6 depicts a technical environment into which various aspects of some embodiments of the present invention can be implemented.

FIG. 6 depicts various aspects of a technical architecture 600 of a computing system comprising aspects of some embodiments of the present invention. In the illustrated example, the technical architecture 600 includes one or more processors 610 to execute program code to complete the aspects of the workflow 100 of FIG. 1. The program code can include and/or can access a cognitive analysis engine 620. The cognitive analysis engine 620 enables the program code to identify function points in architecture details of technical architectures being evaluated by the program code. The cognitive analysis engine 620 is coupled to a data store 630 which includes results from historical analyses of technical architectures, which the program code utilizes, via cognitive analysis, which can include the cognitive analysis engine 620, as a knowledge base, to identify the function points and the decisions. The technical architecture 600 also includes a data repository 640, which can be resident in the data store 630, or can be a separate physical one or more machines, which stores litmus tests for architectural decisions is various computing systems. Based on the requirements of a given computing system, the program code identifies a litmus test to utilize for each element in a decision, in order to assign a disorder value to the decision. In this example, the program code obtains the computing system technical architectures to be evaluated as well as data describing the requirements of the computing system, via a computing node 650. The computing node 650 can include a user interface which a user can utilize to enter this data and/or the computing node can be a repository for this type of data, which the program code accesses. In some embodiments of the present invention, the program code updates the data store 630 by continuing to monitor the performance of a given computing system to update the data store 630 if the disorder of the system is not as indicated by the evaluation of the architecture of that system. Thus, moving forward, the intelligence of the program code in generating a disorder value will increase in accuracy through machine learning. The technical architecture 600 also includes a connection to resource management system 660, which manages the technical architecture of one or more computer systems. In some embodiments of the present invention, if the program code determines that the architecture of one or more of the one or more computer system is above an acceptable threshold for disorder, the program code can automatically or with user approval (through a user interface such the computing node 650), suggest and/or implement changes to the architecture, via the resource management system 660.

Embodiments of the present invention include a computer-implemented method, a computer program product, and a computer system where program code executing on one or more processors obtains architecture detail for a given computing system, where the given computing system comprises one or more function points enabling specific functions within the given computing system, and requirements defining aspirational performance benchmarks for the function points within the given computing system. The program code identifies physical computing components within the given computing systems comprising portions of the architecture detail associated with each of the one or more function points. For each function point and the associated portion of the architecture detail, the program code identifies one or more architectural decisions in the associated portion. The program code determines a disorder value for each architectural decision of the one or more architectural decisions on the associated portion. The program code generates a total disorder value for the architecture detail based on summing the disorder values for each function point of the one or more function points of the architectural detail. The program code determines if the total disorder value exceeds a pre-defined threshold total disorder value for the given computing system.

In some embodiments of the present invention, the program code provides, through a user interface communicatively coupled to the one or more processors, an option to facilitate a change to at least one of the associated portions of the architecture detail, where selecting the option in the user interface, instructs the one or more processors to implement the change in the given computing system.

In some embodiments of the present invention, the program code obtains, based on the selecting of the option, an instruction to implement the change in the given computing system. The program code implements the change in the given computing system.

In some embodiments of the present invention, the program code obtaining the architecture detail and requirements defining aspirational performance benchmarks for the function points within the given computing system comprises the program code receiving the architecture detail and requirements via user entry through the user interface.

In some embodiments of the present invention, the program code obtaining the architecture detail comprises the program code monitoring the given computing system and based on the monitoring, mapping the given computing system to generate the architectural detail.

In some embodiments of the present invention, the program code identifying the physical computing components within the given computing systems comprising portions of the architecture detail associated with each of the one or more function points comprises the program code querying a knowledge base in a data store communicatively coupled to the one or more processors.

In some embodiments of the present invention, the program code identifying the one or more architectural decisions in the associated portion comprises the program code identifying the one or more architectural decisions in a finite set of architectural decision types. The finite set can comprise: function point placement, function point data source and function point integration type.

In some embodiments of the present invention, the program code determining if the total disorder value exceeds the pre-defined threshold total disorder value for the given computing system comprises: the program code determining a maximum disorder value for the architecture detail based on summing maximum disorder values for each function point of the one or more function points, the program code comparing the total disorder value to the maximum disorder value to determine a percentage of the maximum disorder value the total disorder value comprises, and the program code comparing the percentage to the pre-defined threshold.

In some embodiments of the present invention, the program code determining the disorder value for each architectural decision comprises: the program code utilizing the requirements to generate a litmus test to evaluate the portion of the architectural detail associated with the function point, and the program code determining, based on the litmus test, a quality for each architectural decision, wherein the quality is selected from a finite set and wherein each quality is associated with a predefined disorder value. The finite set can comprise decision qualities of ideal, less than ideal, and worst.

In some embodiments of the present invention, the program code identifying the one or more architectural decisions in the associated portion comprises the program code identifying the one or more architectural decisions in a finite set of architectural decision types, where the predefined disorder value associated with each quality is based on the architectural decision type.

In some embodiments of the present invention, based on determining that the total disorder value exceeds the pre-defined threshold total disorder value for the given computing system, the program code displays an alert to a user, through a user interface communicatively coupled to the one or more processors.

Referring now to FIG. 7, a schematic of an example of a computing node, which can be a cloud computing node 10. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove. In an embodiment of the present invention, the one or more processors 610 (FIG. 6), components comprising the resource management system 660 (FIG. 6), the computing node 650 (FIG. 6), the data repository 640 (FIG. 6), the data store 630 (FIG. 6), and the resources comprising the cognitive analysis engine 620 (FIG. 6) can comprise a cloud computing node 10 (FIG. 7) and if not a cloud computing node 10, then one or more general computing nodes that include aspects of the cloud computing node 10.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 7, computer system/server 12 that can be utilized as cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples include, but are not limited to: microcode, device drivers, redundant processing units, external disk drive arrays, RAID systems, tape drives, and data archival storage systems, etc.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs). Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter). Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user specific application configuration settings.

Platform as a Service (PaaS): the capability provided to the consumer is to deploy onto the cloud infrastructure consumer-created or acquired aF1pplications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 8:
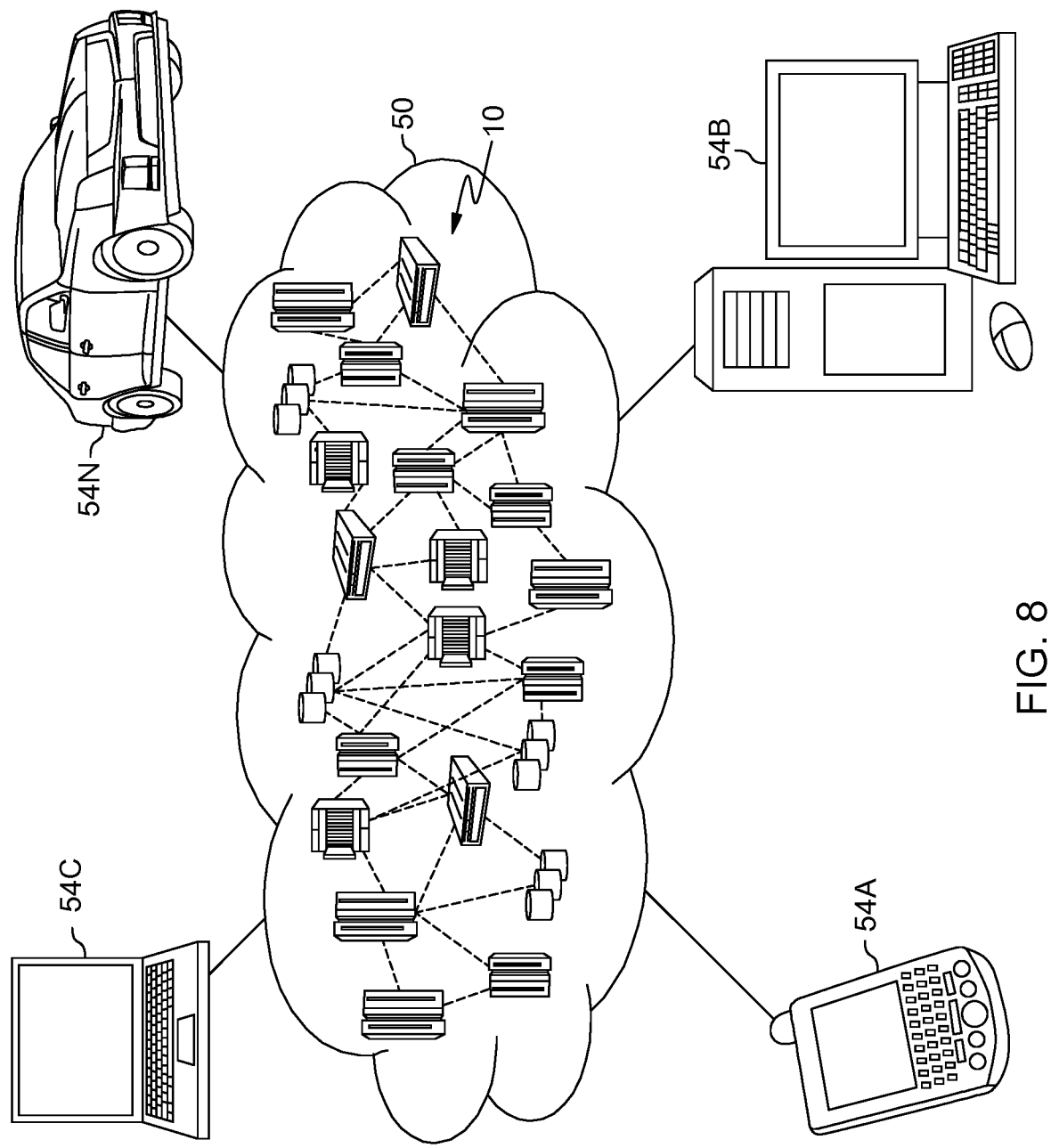
FIG. 8 depicts a cloud computing environment according to an embodiment of the present invention.

Referring now to FIG. 8, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 8 are intended to be illustrative only and that computing nodes 10 and cloud computing environment 50 can communicate with any type of computerized device over any type of network and/or network addressable connection (e.g., using a web browser).

Figure 9:
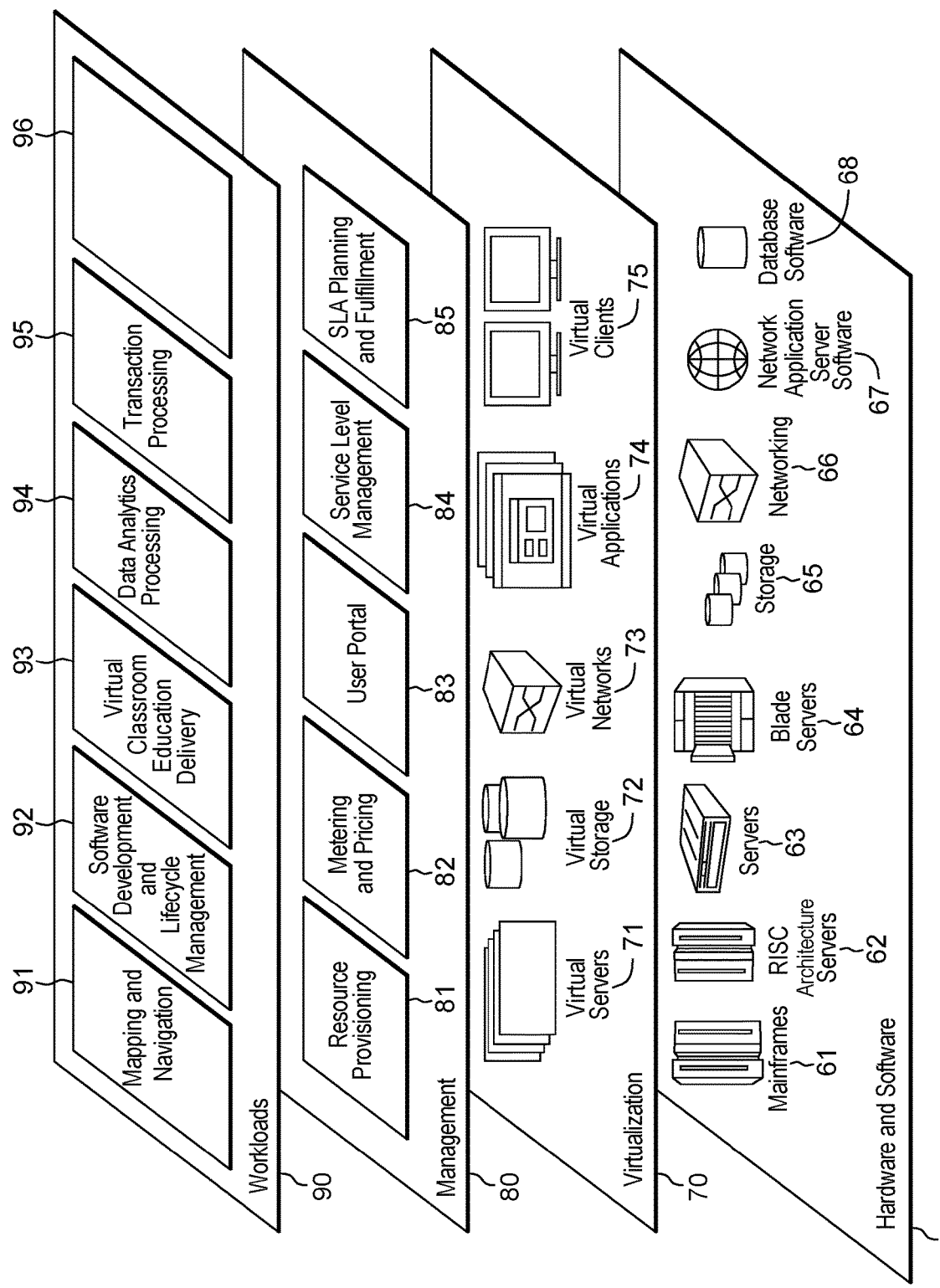
FIG. 9 depicts abstraction model layers according to an embodiment of the present invention.

Referring now to FIG. 9, a set of functional abstraction layers provided by cloud computing environment 50 (FIG. 8) is shown. It should be understood in advance that the components, layers, and functions shown in FIG. 9 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and determining a quantitative disorder value, representing the quality of a technical architecture of the computing system 96.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more embodiments has been presented for purposes of illustration and description, but is not intended to be exhaustive or limited to in the form disclosed. Many modifications and variations will be apparent to those of ordinary skill in the art. The embodiment was chosen and described in order to best explain various aspects and the practical application, and to enable others of ordinary skill in the art to understand various embodiments with various modifications as are suited to the particular use contemplated.

What is claimed is:

1. A computer-implemented method, comprising:
   obtaining, by one or more processors, architecture detail for a given computing system, wherein the given computing system comprises one or more function points enabling specific functions within the given computing system, and requirements defining aspirational performance benchmarks for the function points within the given computing system;
   identifying, by the one or more processors, physical computing components within the given computing systems comprising portions of the architecture detail associated with each of the one or more function points;
   for each function point and the associated portion of the architecture detail:
      identifying, by the one or more processors, one or more architectural decisions in the associated portion, wherein identifying the one or more architectural decisions in the associated portion comprises identifying the one or more architectural decisions in a finite set of architectural decision types, wherein the finite set comprises: function point placement, function point data source and function point integration type;
      determining, by the one or more processors, a disorder value for each architectural decision of the one or more architectural decisions on the associated portion;
   generating, by the one or more processors, a total disorder value for the architecture detail based on summing the disorder values for each function point of the one or more function points of the architectural detail; and
   determining, by the one or more processors, if the total disorder value exceeds a pre-defined threshold total disorder value for the given computing system.

2. The computer-implemented method of claim 1, further comprising:
providing, by the one or more processors, through a user interface communicatively coupled to the one or more processors, an option to facilitate a change to at least one of the associated portions of the architecture detail, wherein selecting the option in the user interface, instructs the one or more processors to implement the change in the given computing system.

3. The computer-implemented method of claim 2, further comprising:
obtaining, by the one or more processors, based on the selecting of the option, an instruction to implement the change in the given computing system; and
implementing, by the one or more processors, the change in the given computing system.

4. The computer-implemented method of claim 1, wherein the obtaining of the architecture detail and requirements defining aspirational performance benchmarks for the function points within the given computing system comprises receiving the architecture detail and requirements via user entry through the user interface.

5. The computer-implemented method of claim 1, wherein the obtaining of the architecture detail comprises monitoring the given computing system and based on the monitoring, mapping the given computing system to generate the architectural detail.

6. The computer-implemented method of claim 1, wherein identifying the physical computing components within the given computing systems comprising portions of the architecture detail associated with each of the one or more function points comprises querying a knowledge base in a data store communicatively coupled to the one or more processors.

7. The computer-implemented method of claim 1, wherein determining if the total disorder value exceeds the pre-defined threshold total disorder value for the given computing system comprises:
determining, by the one or more processors, a maximum disorder value for the architectural detail based on summing maximum disorder values for each function point of the one or more function points;
comparing, by the one or more processors, the total disorder value to the maximum disorder value to determine a percentage of the maximum disorder value the total disorder value comprises; and
comparing, by the one or more processors, the percentage to the pre-defined threshold.

8. The computer-implemented method of claim 1, wherein determining the disorder value for each architectural decision comprises:
utilizing, by the one or more processors, the requirements to generate a litmus test to evaluate the portion of the architectural detail associated with the function point; and
determining, based on the litmus test, a quality for each architectural decision, wherein the quality is selected from a finite set and wherein each quality is associated with a predefined disorder value.

9. The computer-implemented method of claim 8, wherein the finite set comprises decision qualities of ideal, less than ideal, and worst.

10. The computer-implemented method of claim 9, wherein identifying the one or more architectural decisions in the associated portion comprises identifying the one or more architectural decisions in a finite set of architectural decision types, and wherein the predefined disorder value associated with each quality is based on the architectural decision type.

11. The computer-implemented method of claim 1, further comprising:
based on determining that the total disorder value exceeds the pre-defined threshold total disorder value for the given computing system, displaying, by the one or more processors, an alert to a user, through a user interface communicatively coupled to the one or more processors.

12. A computer program product comprising:
a computer readable storage medium readable by one or more processors of a shared computing environment and storing instructions for execution by the one or more processors for performing a method comprising:
obtaining, by the one or more processors, architecture detail for a given computing system, wherein the given computing system comprises one or more function points enabling specific functions within the given computing system, and requirements defining aspirational performance benchmarks for the function points within the given computing system;
identifying, by the one or more processors, physical computing components within the given computing systems comprising portions of the architecture detail associated with each of the one or more function points;
for each function point and the associated portion of the architecture detail:
identifying, by the one or more processors, one or more architectural decisions in the associated portion, wherein identifying the one or more architectural decisions in the associated portion comprises identifying the one or more architectural decisions in a finite set of architectural decision types, wherein the finite set comprises: function point placement, function point data source and function point integration type;
determining, by the one or more processors, a disorder value for each architectural decision of the one or more architectural decisions on the associated portion;
generating, by the one or more processors, a total disorder value for the architecture detail based on summing the disorder values for each function point of the one or more function points of the architectural detail; and
determining, by the one or more processors, if the total disorder value exceeds a pre-defined threshold total disorder value for the given computing system.

13. The computer program product of claim 12, the method further comprising:
providing, by the one or more processors, through a user interface communicatively coupled to the one or more processors, an option to facilitate a change to at least one of the associated portions of the architecture detail, wherein selecting the option in the user interface, instructs the one or more processors to implement the change in the given computing system.

14. The computer program product of claim 13, further comprising:
obtaining, by the one or more processors, based on the selecting of the option, an instruction to implement the change in the given computing system; and
implementing, by the one or more processors, the change in the given computing system.

15. The computer program product of claim 12, wherein the obtaining of the architecture detail and requirements defining aspirational performance benchmarks for the function points within the given computing system comprises receiving the architecture detail and requirements via user entry through the user interface.

16. The computer program product of claim 12, wherein the obtaining of the architecture detail comprises monitoring the given computing system and based on the monitoring, mapping the given computing system to generate the architectural detail.

17. The computer program product of claim 12, wherein identifying the physical computing components within the given computing systems comprising portions of the architecture detail associated with each of the one or more function points comprises querying a knowledge base in a data store communicatively coupled to the one or more processors.

18. A computer system comprising:
   a memory;
   one or more processors in communication with the memory;
   program instructions executable by the one or more processors in a shared computing environment via the memory to perform a method, the method comprising:
      obtaining, by the one or more processors, architecture detail for a given computing system, wherein the given computing system comprises one or more function points enabling specific functions within the given computing system, and requirements defining aspirational performance benchmarks for the function points within the given computing system;
      identifying, by the one or more processors, physical computing components within the given computing systems comprising portions of the architecture detail associated with each of the one or more function points;
      for each function point and the associated portion of the architecture detail:
         identifying, by the one or more processors, one or more architectural decisions in the associated portion, wherein identifying the one or more architectural decisions in the associated portion comprises identifying the one or more architectural decisions in a finite set of architectural decision types, wherein the finite set comprises: function point placement, function point data source and function point integration type;
         determining, by the one or more processors, a disorder value for each architectural decision of the one or more architectural decisions on the associated portion;
      generating, by the one or more processors, a total disorder value for the architecture detail based on summing the disorder values for each function point of the one or more function points of the architectural detail; and
      determining, by the one or more processors, if the total disorder value exceeds a pre-defined threshold total disorder value for the given computing system.

\* \* \* \* \*